United States Patent [19]

Earl et al.

[11] Patent Number: 5,469,171
[45] Date of Patent: Nov. 21, 1995

[54] HF BACKGROUND NOISE MEASUREMENT IN HF ENVIRONMENTS

[75] Inventors: George F. Earl; Bruce D. Ward, both of Adelaide, Australia

[73] Assignee: The Commonwealth of Australia, C/-The Secretary, Department of Defense, Canberra, Australia

[21] Appl. No.: 140,087

[22] PCT Filed: May 1, 1992

[86] PCT No.: PCT/AU92/00197

§ 371 Date: Dec. 8, 1993

§ 102(e) Date: Dec. 8, 1993

[87] PCT Pub. No.: WO92/19981

PCT Pub. Date: Nov. 12, 1992

[30] Foreign Application Priority Data

May 2, 1991 [AU] Australia .................................. PK5953

[51] Int. Cl.$^6$ ........................................................ H01Q 3/00
[52] U.S. Cl. ...................... 342/159; 342/165; 324/76.13; 324/76.19
[58] Field of Search ............................. 342/159, 13, 165; 324/77 A, 77 B, 77 C, 76.13, 76.17, 76.19, 76.26

[56] References Cited

U.S. PATENT DOCUMENTS 4,754,278 6/1988 Fazio et al. .
5,056,051 10/1991 Tkalcevic .

FOREIGN PATENT DOCUMENTS 0068078 1/1983 European Pat. Off. .
9413951 2/1991 European Pat. Off. .

Primary Examiner—Mark Hellner
Attorney, Agent, or Firm—Cushman Darby & Cushman

[57] ABSTRACT

A frequency surveillance method for monitoring background atmospheric noise levels in unoccupied channels in an operating frequency band of a high frequency communication system. In the method, the unoccupied channels are scanned a number of times to obtain analogue signals. The obtained signals are transformed to a digital form and averaged. The averaged digital signals are filtered to remove substantially all radio frequency interference. Absolute signals are then produced by scaling or comparing the filtered signals with a known noise level. The background noise levels are obtained by further averaging the absolute signals. A visual display unit is used to display the background noise levels as a function of frequencies. A frequency surveillance apparatus is also disclosed.

18 Claims, 3 Drawing Sheets

HF BACKGROUND NOISE MEASUREMENT IN HF ENVIRONMENTS

FIELD OF THE INVENTION

This invention relates to frequency surveillance systems and in particular to a method and apparatus for determining the background atmospheric noise level in unoccupied channels in an operating band. In addition the invention relates to a system of selecting an appropriate operating frequency to minimise the effects of interference.

BACKGROUND

It is well known by communicators using the high frequency (HF) bands that performance depends largely on frequency selection. This is due in large part to the vagaries of the ionosphere. For HF skywave radars, or Over-the-Horizon Radars (OTHR), it is particularly important that the optimum frequency is chosen for the task at hand. This leads to a requirement for real-time frequency advice on a continuous basis.

An HF system will normally consist of one or more antennas connected to one or more receivers. The antennas may be omnidirectional or may be physically arranged to have a degree of directionality. In addition, various analogue techniques can be used to form receiver beams having a defined direction and width. The signals from the antennas are often subjected to some degree of analogue filtering before reaching the receiver. The receiver output can be converted from analogue to digital form before undergoing further processing and analysis. Once in digital form phase weighting techniques can be used to form multiple simultaneous beams.

It is an object of this invention to provide a method and apparatus for monitoring a frequency band and providing an indication of the background atmospheric noise levels in selected unoccupied channels. A method and apparatus for selecting unoccupied channels is disclosd in Patent Application Number PCT/AU92/00201.

It is desirable to operate any HF system at the optimum signal to noise ratio. For an OTHR which relies on backscattered signals this translates to a requirement to select an operating frequency which is based on the clutter to noise ratio. Clutter refers to the signal backscattered from the earth's surface.

A number of sub-systems such as sounders provide information for determining the optimum operating frequency band for a given combination of ionospheric conditions. Once a frequency band has been selected however, an unoccupied channel must be chosen in which to operate. This invention is designed to aid in this choice.

SUMMARY OF THE INVENTION

Therefore, in one form of this invention, there is proposed a frequency surveillance system which monitors an entire frequency band on a continuous basis and provides an indication of the background environmental noise in the band.

In a further form of this invention there is proposed a method of determining background environmental noise in a selected frequency band comprising the steps of:

accumulating a plurality of scans of analogue signals from each of a plurality of input sources;

transforming the signals;

averaging the transformed signals from a number of scans;

rejecting those digital signals affected by radio frequency interference (RFI) to produce substantially RFI free averaged signals;

scaling the RFI free averaged signals to absolute signals;

further averaging the absolute signals to produce a background noise level;

and displaying the background noise level as a function of frequency on a visual display means.

In preference the plurality of scans are accumulated from a plurality of antennas such that a block of scans is taken from each antenna.

In preference the plurality of antennas consists of omnidirectional antennas and directional antennas.

In preference the step of transforming the signals includes converting the analogue signals to digital form and applying a Fourier transform to the digital signals to produce the transformed signals.

In preference the step of averaging the transformed signals from a number of scans is applied to a block of scans.

In preference a block of scans consists of four scans.

In preference the digital signals affected by radio frequency interference are rejected by applying an RFI filter.

The RFI free averaged signals are preferably scaled to absolute signals by comparison with signals received from a reference noise source. The reference noise source is preferably noise at −170 dBW/Hz.

In preference the absolute signals are further averaged by averaging over the plurality of antennas. There are preferably two omnidirectional antennas and eight directional antennas in the form of array beams.

In a further form the method includes the additional step of checking signals for the effects of impulsive noise by comparing the amplitude of signals at a given frequency from a number of scans. Large signal amplitudes which occur in a small minority of the scans are assumed to be due to impulsive noise and are therefore removed.

In further form of this invention there is provided a frequency surveillance apparatus for monitoring the background noise level in a selected frequency band, consisting of:

a plurality of omnidirectional antennas;

a plurality of directional antennas;

a reference noise source for providing a signal for calibration of the apparatus;

a radio frequency receiver input unit for selecting signals input from an appropriate antenna;

a filter unit to reduce the effects of radio frequency interference on the signals from any one of the plurality of antennas;

a receiver unit for tuning across the frequency band;

an analogue to digital conversion unit;

a processor unit to transform and average digitised signals; and a visual display means to display the average digitised signals from the processor unit.

In preference the apparatus also has a local oscillator unit which supplies a signal to the receiver for use in deramping the received signal.

BRIEF DESCRIPTION OF THE DRAWINGS

For a better understanding of this invention a preferred embodiment will now be described with reference to the attached drawings in which.

DESCRIPTION OF PRESENTLY PREFERRED EMBODIMENTS

Figure 1:
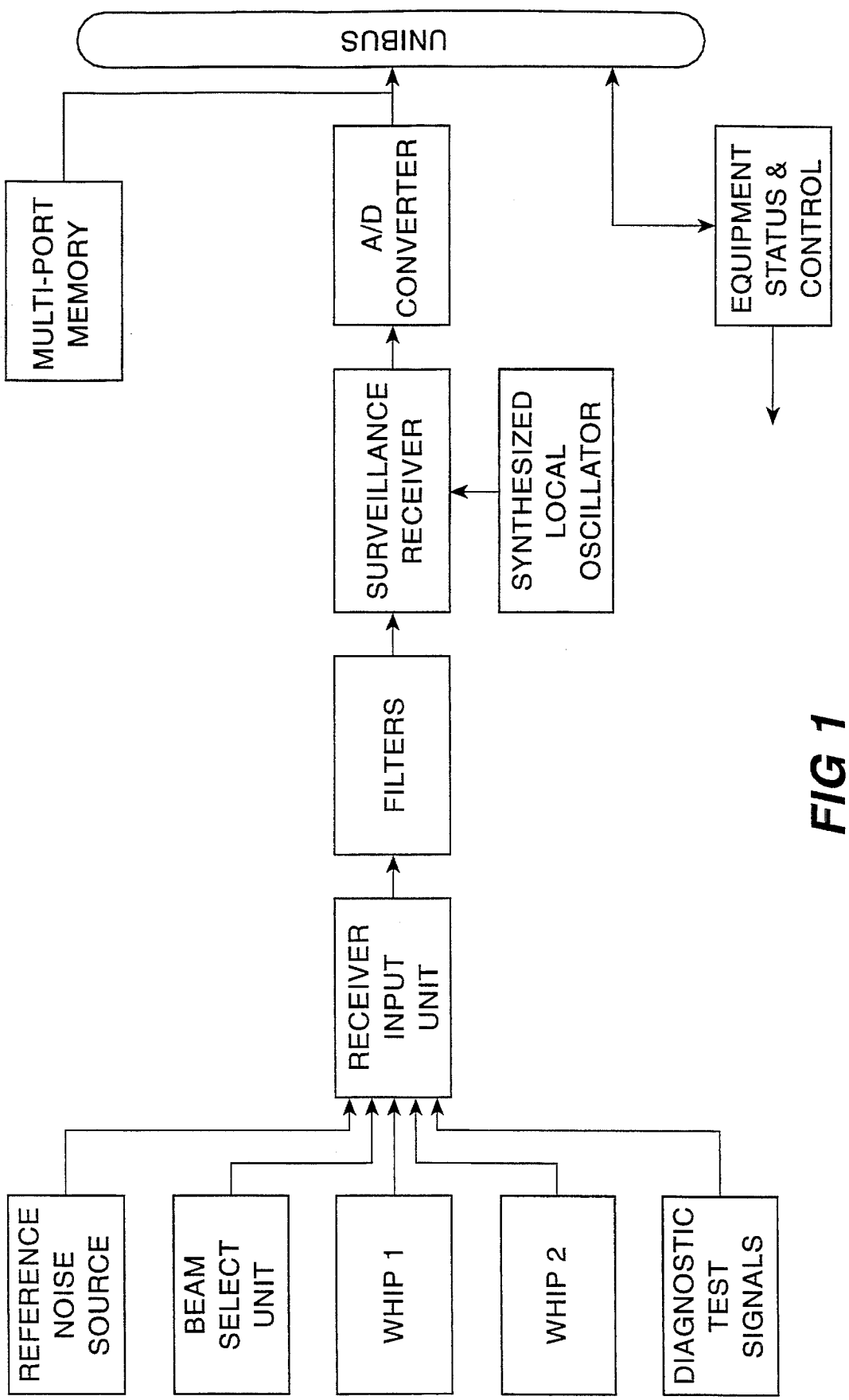
FIG. 1 is a schematic view of a surveillance system.
Figure 2:
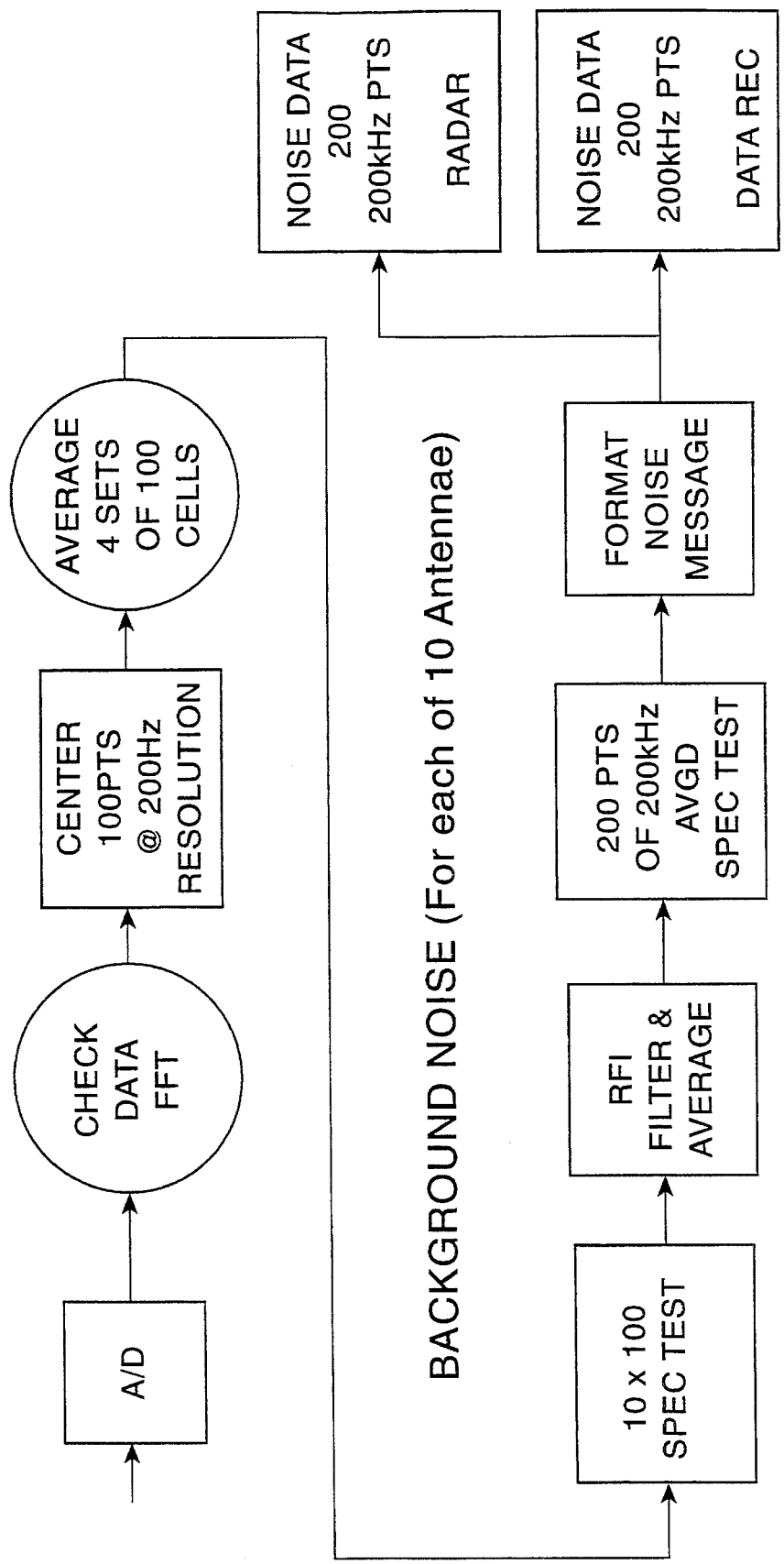
FIG. 2 is a flow chart of the background noise measurement method.

The invention will be described with reference to a known Over-the-Horizon Radar system, although it will be appreciated that the invention is in no way limited to this application.

The surveillance system consists of a receiver input unit which is able to select an input from any one of eight array beams via a beam select unit, either of two omnidirectional antennas, a reference noise source or a diagnostic test signal generator. The receiver input unit is connected via suitable filters to a single receiver.

The receiver has a bandwidth of 20 kHz and the output is digitised at a sampling rate of 51.2 kHz. Data is acquired over an interval of 5 ms and subjected to spectral analysis, leading to a fundamental frequency resolution of 200 Hz. To remove the effects of passband fluctuations this process is repeated a number of times and the average is taken. The gain and frequency of the receiver are under direct computer control and the entire data acquisition process is coded in such a manner that it maximises the effective rate at which data can be acquired.

To calibrate the data a noise signal is injected into the receiver at a known level (−170 dBW/Hz) at the beginning of each set of observations. Noise signal samples are acquired over a 5 msec interval as above and a fast Fourier transform is used to transform the data to a power spectrum. The resultant power spectrum is an absolute calibration of the response characteristics of the receiver system and is therefore used to scale all subsequent spectral estimates.

In the background noise method, noise levels are measured on each of the eight beams of the array and on two omnidirectional antennas. Measurements are made in the quietest 26 kHz channel within each 1 MHz segment of the spectrum, with the receiver tuned to the center of this band. The quietest 26 kHz channel makes allowance for the skirt selectivity of the nominally 20 kHz wide passband.

At each frequency, four blocks of data are acquired for each antenna or array beam. The data is checked to ensure that the receiver gain was within acceptable limits and is transformed using a 256 point fast Fourier transform to yield 100 points at 200 Hz resolution. The four sets of data are then averaged. Ten such sets of data, one for each omnidirectional antenna or array beam, are acquired, generating a 10 by 100 array consisting of 10 measurements of the 20 kHz segment of the spectrum at 200 Hz resolution. In the absence of radio frequency interference (RFI) the 100 spectral estimates from each observation represent independent measurements of the background noise level, but in reality a number will be affected by RFI.

Those frequency estimates contaminated by RFI are identified and removed using an RFI filter. A number of RFI filters are available however a simple filter that has proved effective involves determining the average and minimum values of signal amplitude for each row and column of the 10 by 100 array. If the average of a row or column exceeds the minimum value of that row or column by 9 dB, then that row or column is rejected.

Furthermore, impulsive noise bursts may affect one or more of the 10 scans. Those scans which have been affected by impulsive noise bursts are discarded. The remaining spectral estimates are averaged to produce a measure of the background noise level in each 1 MHz band. The levels are then displayed on a display unit as a function of frequency and are also available as input to a real-time frequency management system.

Figure 3:
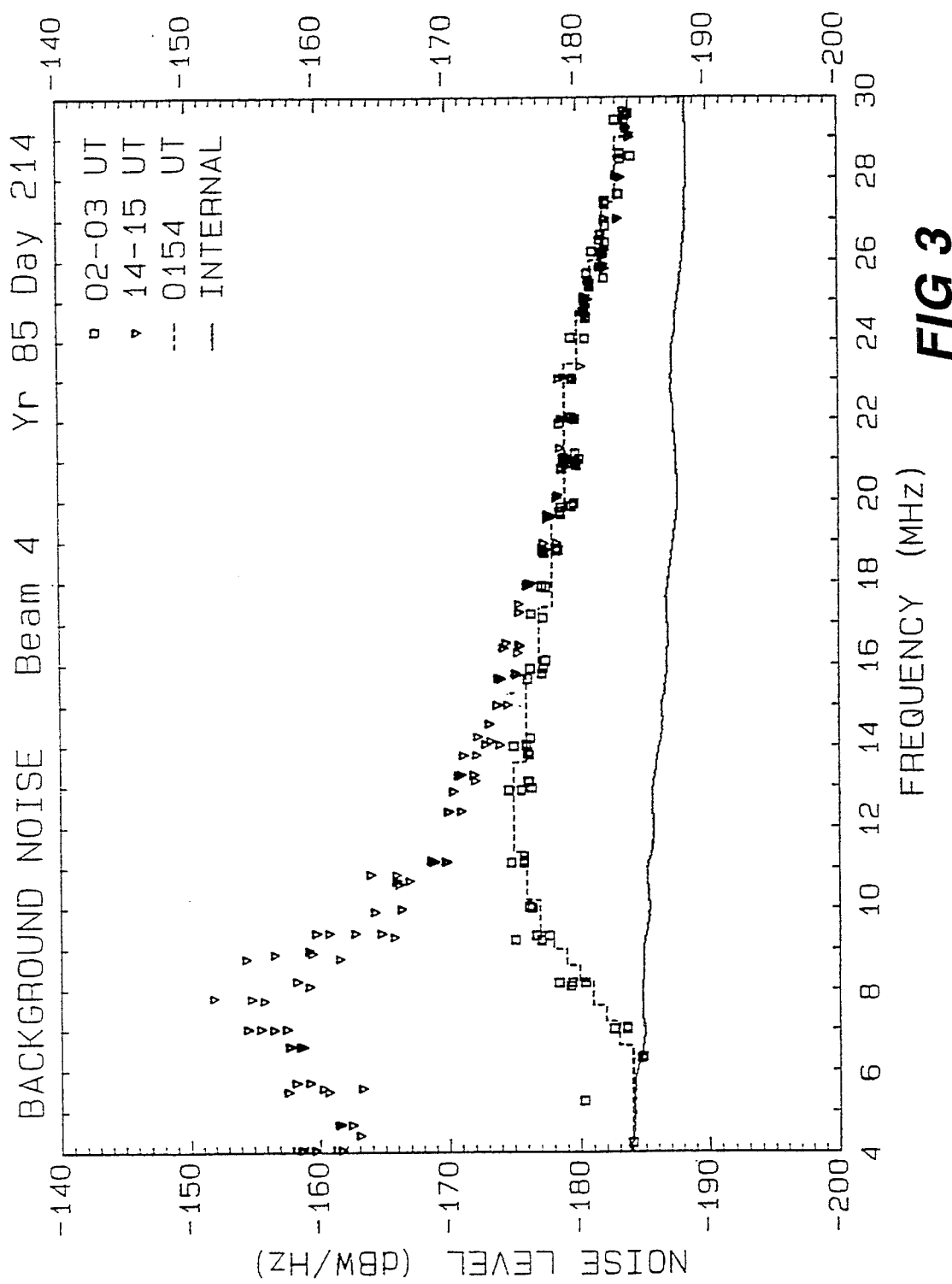
FIG. 3 is an example of the output of the method.

FIG. 3 shows a typical signal level display measured over the 4 to 30 MHz band. The background environmental noise level is shown for two different one hour intervals. Curve 8 shows the background noise level at midnight and curve 9 shows the level at midday. The solid line 10 is the internal noise level of the surveillance system.

Throughout this specification the purpose has been to illustrate the invention and not to limit this.

We claim:

1. A method of determining background environmental noise in a selected frequency band comprising the steps of:

accumulating a plurality of scans of analogue signals from each of a plurality of input sources;

transforming the accumulated signals;

averaging the transformed signals from a number of scans;

rejecting those digital signals affected by radio frequency interference (RFI) to produce substantially RFI free averaged signals;

scaling the RFI free averaged signals to produce absolute signals;

further averaging the produced absolute signals to produce a background noise level; and displaying the background noise level as a function of frequency on a visual display means.

2. The method of claim 1 in which the plurality of scans are accumulated from a plurality of antennas such that a block of scans is taken from each antenna.

3. The method of claim 2 in which the plurality of antennas consists of omnidirectional antennas and directional antennas.

4. The method of claim 1 in which the step of transforming the signals includes converting the analogue signals to digital form and applying a Fourier transform to the converted digital signals to produce the transformed signals.

5. The method of claim 1 in which the step of averaging the transformed signals from a number of scans is applied to a block of scans.

6. The method of claim 5 in which a block of scans consists of four scans.

7. The method of claim 1 in which the digital signals affected by radio frequency interference are rejected by applying an RFI filter.

8. The method of claim 1 in which the RFI free averaged signals are scaled to absolute signals by comparison with signals received from a reference noise source.

9. The method of claim 8 in which the reference noise source is noise at a magnitude of −170 dBW/Hz.

10. The method of claim 1 in which the absolute signals are further averaged by averaging over the plurality of antennas.

11. The method of claim 10 in which there are preferably two omnidirectional antennas and eight directional antennas in the form of array beams.

12. A frequency surveillance apparatus for monitoring the background noise level in a selected fequency band, consisting of:

a plurality of antennas;

a reference noise source adapted to provide a signal for calibration of the apparatus;

a radio frequency receiver input unit adapted to select signals input from any one of the plurality of antennas;

a filter unit adapted to reduce the effects of radio frequency interference on the signals from any one of the plurality of antennas;

a receiver unit adapted to tune across the frequency band and receive analogue signals from the input selected by the receiver input unit;

an analogue to digital conversion unit adapted to convert the analogue signals received by the receiver to digital form;

a processor unit adapted to transform and average digitised signals; and a visual display means to display the average digitised signals from the processor unit.

13. The apparatus of claim 12 further comprising a local oscillator unit for supplying a signal to the receiver unit for use in deramping the received signal.

14. The apparatus of claim 12 in which the plurality of antennas consists of a plurality of omnidirectional antennas and a plurality of directional antennas.

15. The apparatus of claim 14 in which the number of omnidirectional antennas is two.

16. The apparatus of claim 14 in which the number of directional antennas is eight being eight beams of an antenna array.

17. The apparatus of claim 12 in which the reference noise source provides a calibrating signal of −170 dBW/Hz.

18. The apparatus of claim 12 in which the processor unit applies a Fourier transform to digital signals received from the analogue to digital conversion unit, averages signals, removes the effects of interference from signals, and provides a resultant signal to the visual display means for display.

* * * * *